(12) United States Patent
Lei

(10) Patent No.: US 6,225,849 B1
(45) Date of Patent: May 1, 2001

(54) HIGH SPEED, HIGH PRECISION, POWER SUPPLY AND PROCESS INDEPENDENT BOOST LEVEL CLAMPING TECHNIQUE

(75) Inventor: Tom G. Lei, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/512,617

(22) Filed: Feb. 25, 2000

(51) Int. Cl.[7] .................................................. H03K 5/08
(52) U.S. Cl. ............................................. 327/321; 327/323
(58) Field of Search ..................................... 327/309, 310, 327/312, 313, 317, 318, 321, 323, 324, 327, 328, 331, 332, 536

(56) References Cited

U.S. PATENT DOCUMENTS 5,642,313 * 6/1997 Ferris ............................... 365/185.25
5,642,315 * 6/1997 Yamaguchi ....................... 365/189.09
6,069,518 * 5/2000 Nakai et al. ............................ 327/535

* cited by examiner

Primary Examiner—Jeffrey Zweizig
(74) Attorney, Agent, or Firm—Davis Chin

(57) ABSTRACT

A boost level clamping circuit and a method for clamping a boosted wordline voltage from a booster circuit used in a semiconductor memory device is provided which is power supply and process corner independent. The clamping circuit is formed of a plurality of parallel-connected clamp stages connected to the boosted wordline voltage from the booster circuit. Each of the plurality of clamp stages serves to clamp the boosted wordline voltage at different predetermined levels. Each of the clamp stages is formed of a sampling circuit, a comparator circuit, a pulse generator circuit, and a pull-down circuit.

18 Claims, 5 Drawing Sheets

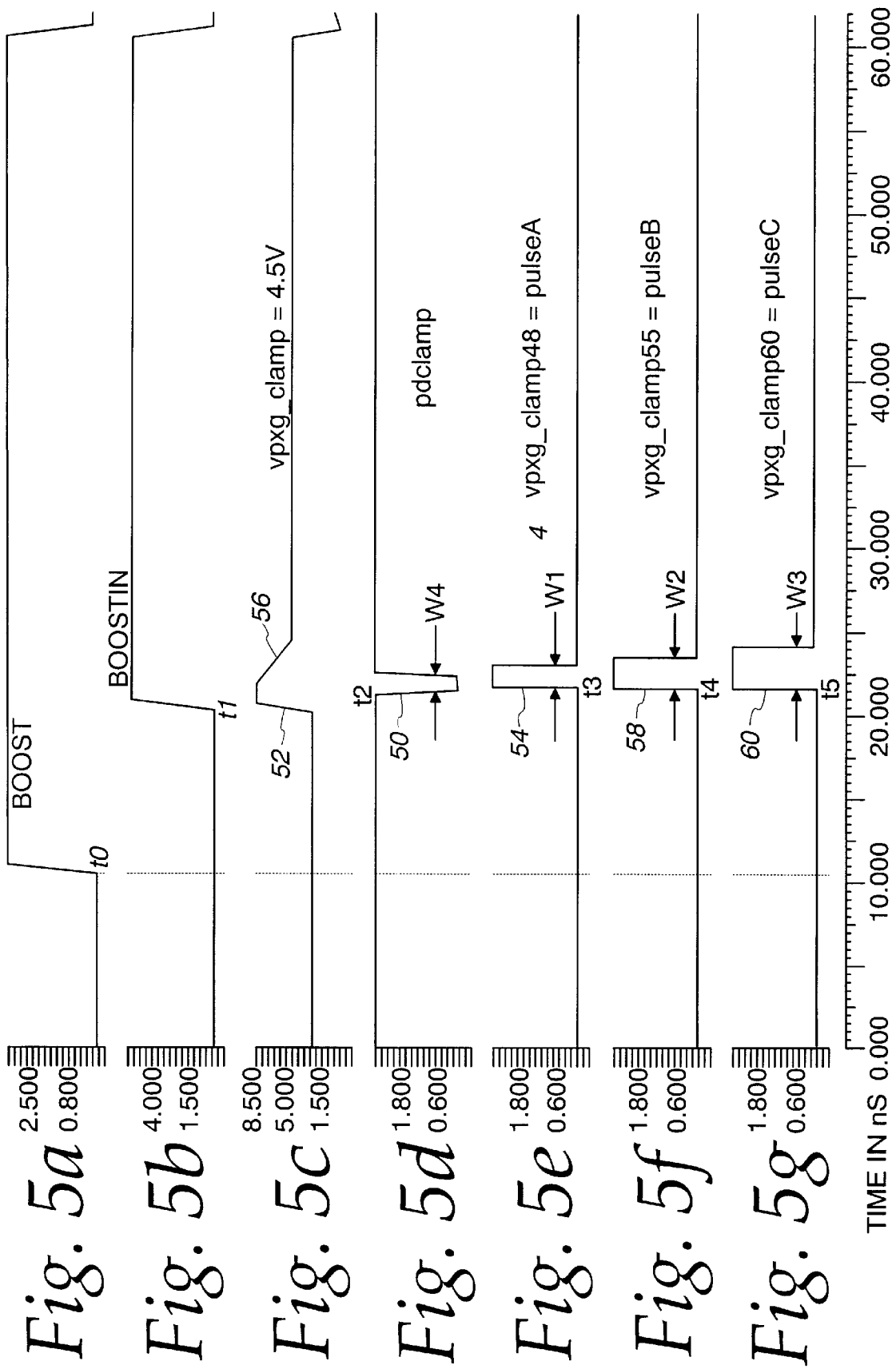

HIGH SPEED, HIGH PRECISION, POWER SUPPLY AND PROCESS INDEPENDENT BOOST LEVEL CLAMPING TECHNIQUE

BACKGROUND OF THE INVENTION

This invention relates generally to booster circuits for use in semiconductor memory devices such as Flash EEPROM devices and more particularly, it relates to a boost level clamping circuit and method for clamping a boosted wordline voltage from a booster circuit used in a semiconductor memory device which is power supply and process corner independent.

In Flash EEPROM memory devices, it is often required voltages to be internally generated that are greater than an external or off-chip power supply potential VCC which is applied to it. For example, it is known that in the Flash EEPROM memory devices operating at the power supply potential VCC equal to +3.0 volts, a high voltage of approximately +5.0 volts is needed to be produced for the reading mode of operation of the memory cells. As a consequence, the semiconductor memories also generally include an internal voltage boosting circuit for generating an output signal boosted to be higher than the external power supply potential, which is supplied to a wordline driver circuit connected to the wordline.

One of the ways of saving power consumption is to operate the booster circuit only during the active period when the wordline is activated and not during the standby mode. As a result, for the boosting operation during the active period, the boosted voltage level must be raised very quickly from its original power supply level VCC in a short amount of time. Typically, the boosting circuit has only a small current drive capability and cannot perform adequately this operation, which reduces the operating speed of the semiconductor memory. In order to solve this problem, there has been attempted in the prior art of producing a larger boosting circuit for boosting the external power supply potential to be higher than the actual boosted voltage level required at the wordline so as to increase its speed of operation.

However, this larger boosting circuit is not without any shortcomings. Since the wordline voltage will now be possibly higher than what is required, there will be created increased stress (over-stressing) on the gates of the memory core transistors connected to the wordline. In order to solve this shortcoming, there has been developed in the prior art booster clamping circuits for clamping the boosted voltage level from the booster so as to prevent over-stressing of the wordline core transistor. Unfortunately this booster clamping circuit has slowed down the boosting speed of operation. Further, since the boosted voltage level applied to the wordline is created from the booster circuit, it will vary greatly with the power supply voltage VCC and process corners.

Accordingly, it would be desirable to provide a boost level clamping circuit for clamping a boosted wordline voltage from a booster circuit used in a semiconductor memory device which is independent of variations in the power supply potential and process corners. It would be expedient that the booster clamping circuit have a high reliability and a higher speed of operation. This is accomplished in the present invention by the provision of a booster level clamping circuit which is formed of a plurality of parallel-connected clamp stage circuits connected to the boosted wordline voltage from the booster circuit. Each of the plurality of clamp stages is used to clamp the boosted wordline voltage only when it reaches one of a number of different predetermined levels.

SUMMARY OF THE INVENTION

Accordingly, it is a general object of the present invention to provide a boost level clamping circuit and method for clamping a boosted wordline voltage from a booster circuit used in a semiconductor memory device which overcomes the disadvantages of the prior art clamping circuits.

It is an object of the present invention to provide a boost level clamping circuit and a method for clamping a boosted wordline voltage from a booster circuit used in a semiconductor memory device which is power supply and process corner independent.

It is another object of the present invention to provide a boost level clamping circuit and a method for clamping a boosted wordline voltage from a booster circuit used in a semiconductor memory device which has a higher precision control so as to prevent over-boosting, thereby avoiding over-stressing of the wordline.

It is still another object of the present invention to provide a boost level clamping circuit for clamping a boosted wordline voltage from a booster circuit used in a semiconductor memory device which includes a plurality of parallel-connected clamp stages each being formed of a sampler circuit, a comparator circuit, a pulse generator, and a pull-down circuit.

In a preferred embodiment of the present invention, there is provided a boost level clamping circuit for clamping a boosted wordline voltage from a booster circuit used in a semiconductor memory device which is power supply and process corner independent. The clamping circuit includes a plurality of parallel-connected clamp stages connected to the boosted wordline voltage from the booster circuit. The plurality of clamp stages includes at least a first clamp stage for clamping the boosted wordline voltage only when it reaches a predetermined level, a second clamp stage for clamping the boosted wordline voltage only when it reaches a second predetermined level which is higher than the first predetermined level, and a third clamp stage for clamping the boosted wordline voltage only when it reaches a third predetermined level which is higher than the second predetermined level.

Each of the first, second and third clamp stages is formed of a sampling circuit, a comparator circuit, a pulse generator, and a pull-down circuit. The sampling circuit is used to sample the boosted wordline voltage. The comparator circuit compares a sample voltage level of the boosted wordline voltage and a reference voltage level and causes a low logic signal to be generated when the sampled voltage level is greater than the reference voltage level. The pulse generator produces a clamp pulse in response to the low logic signal. The pull-down circuit is responsive to the clamp pulse for pulling down the boosted wordline voltage so as to prevent overboosting of a wordline connected to it.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIGS. 5(a)–5(g) are waveforms at various points of the clamping circuit of FIG. 2, useful for explaining its operation.

DESCRIPTION OF THE PREFERRED EMBODIMENT

Figure 1:
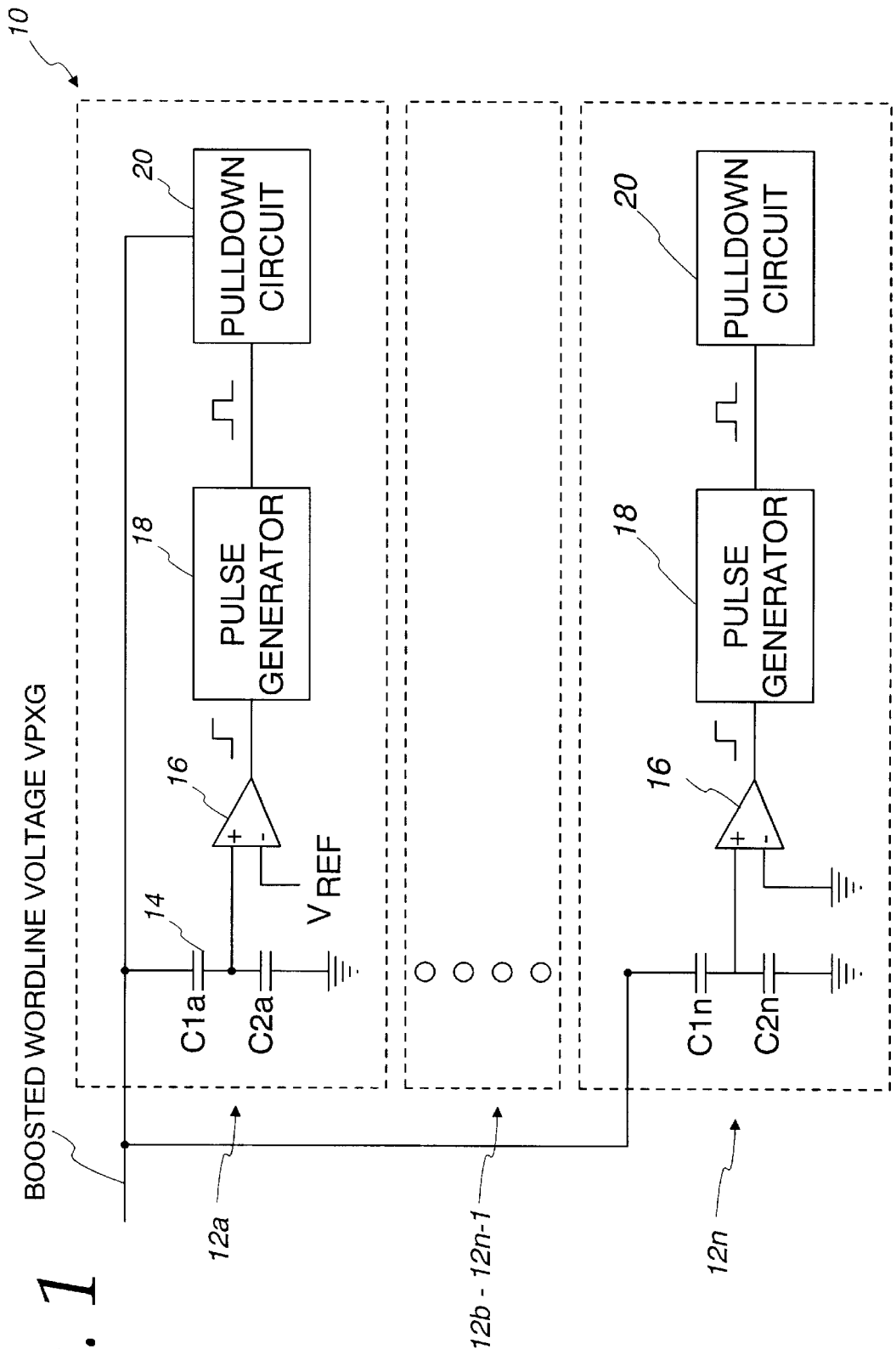
FIG. 1 is a simplified functional block diagram of a boosted level clamping circuit, constructed in accordance with the principles of the present invention.

Referring now in detail to the drawings, there is shown in FIG. 1 a simplified functional block diagram of a boost level clamping circuit 10, constructed in accordance with the principles of the present invention. The clamping circuit 10 of the present invention is connected to an output signal or a boosted wordline voltage VPXG from a booster circuit (not shown) for clamping the boost level thereof so as to prevent over-stressing of the wordline to which it is connected. The boost clamping level is independent of the variations in the power supply potential and process corners. As a consequence, the clamping circuit 10 provides a high precision control of the boosted wordline voltage VPXG connected to the wordline. Further, the clamping circuit has a high reliability and a higher speed of operation. The clamping circuit 10 consists of a plurality of parallel connected clamp circuit stages 12a, 12b, 12c, . . . 12n coupled to the boosted wordline voltage VPXG from the booster circuit.

Each of the clamp circuit stages 12a, . . . 12n includes a sampling circuit formed of a capacitor divider network 14, a comparator circuit 16, a pulse generator circuit 18, and a pull-down circuit 20. The capacitor divider network 14 for the clamp circuit stage 12a is formed by a first capacitor C1a and a second capacitor C2a connected in series with the first capacitor C1a. The capacitor divider network 14 for the clamp circuit stage 12b is formed by a first capacitor C1b and a second capacitor C2b connected in series with the first capacitor C1b. The capacitor divider network 14 for the clamp circuit stage 12n is formed by a first capacitor C1n and-a second-capacitor C2n connected in series with the first capacitor C1n.

Each of the capacitor divider networks 14 are all identical in the clamp circuit stages 12a through 12n. However, the values of the individual capacitors C1a, C2a through C1n, C2n are different so as to control the different boost clamping levels by sampling the boosted wordline voltage VPXG. Except for this difference, each of the clamp circuit stages 12a through 12n are identical in their construction and operation. In other words, the comparator circuit 16, the pulse generator circuit 18, and the pull-down circuit 20 in the respective clamp circuit stages 12a through 12n are all identical in their construction.

Figure 2:
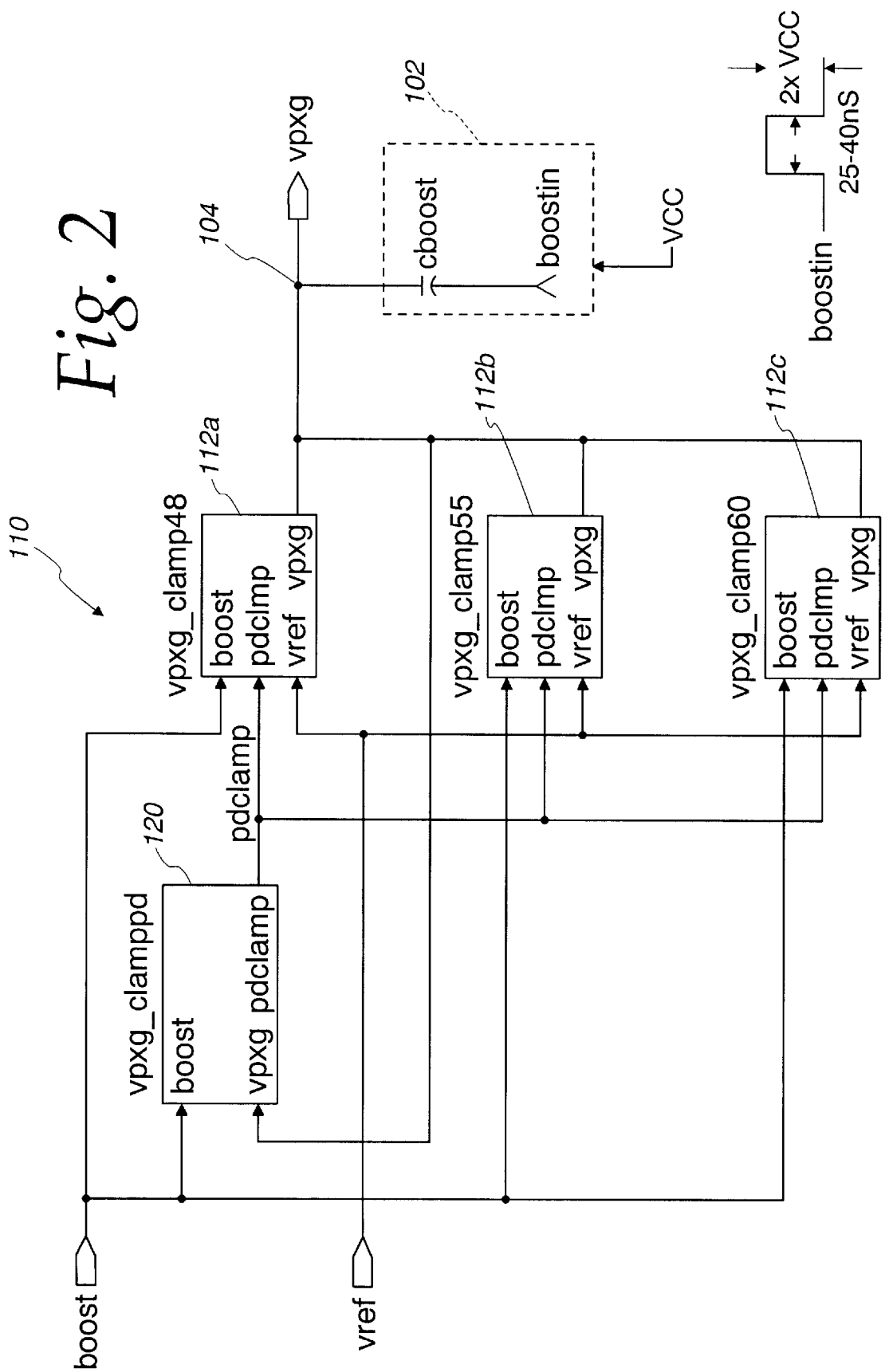
FIG. 2 is a circuit block diagram of the clamping circuit of FIG. 1 being formed of three clamp stages for use with a booster circuit.

The number of clamp circuit stages can be made to be any number dependent upon the control accuracy desired. In FIG. 2, there is shown a circuit block diagram of the boost level clamping circuit 110 of the present invention which is connected to the boosted wordline voltage VPXG from a booster circuit 102. As can be seen, the booster circuit 102 receives an external power supply potential VCC and generates an internal voltage BOOSTIN which is a pulse voltage having an amplitude equal to twice the supply potential (2×VCC) and a width of approximately 25–40 nS. The internal voltage BOOSTIN is capacitively coupled through a boost capacitor CBOOST in order to produce the boosted wordline voltage VPXG at an output node 104.

For convenience of illustration, the boost clamping circuit 110 is shown to be formed of three clamp circuit stages 112a, 112b, and 112c, and a power-down clamp circuit 120. The first clamp circuit stage 112a is used to clamp the boosted wordline voltage only when it reaches a first predetermined level of +4.8 volts and is designated as "VPXG_CLAMP48". The second clamp circuit stage 112b is used to clamp the boosted wordline voltage only when it reaches a second predetermined level of +5.5 volts and is labeled "VPXG_CLAMP55". The third clamp circuit stage 112c is used to clamp the boosted wordline voltage only when it reaches a third predetermined level of +6.0 volts and is labeled "VPXG_CLAMP60". The power-down clamp circuit 120 is used to conserve power dissipation during a power-down mode of operation. Since each of the clamp circuit stages 112a–112c are identical in their construction, it will be sufficient to illustrate and discuss in detail only the clamp circuit stage 112a.

Figure 3:
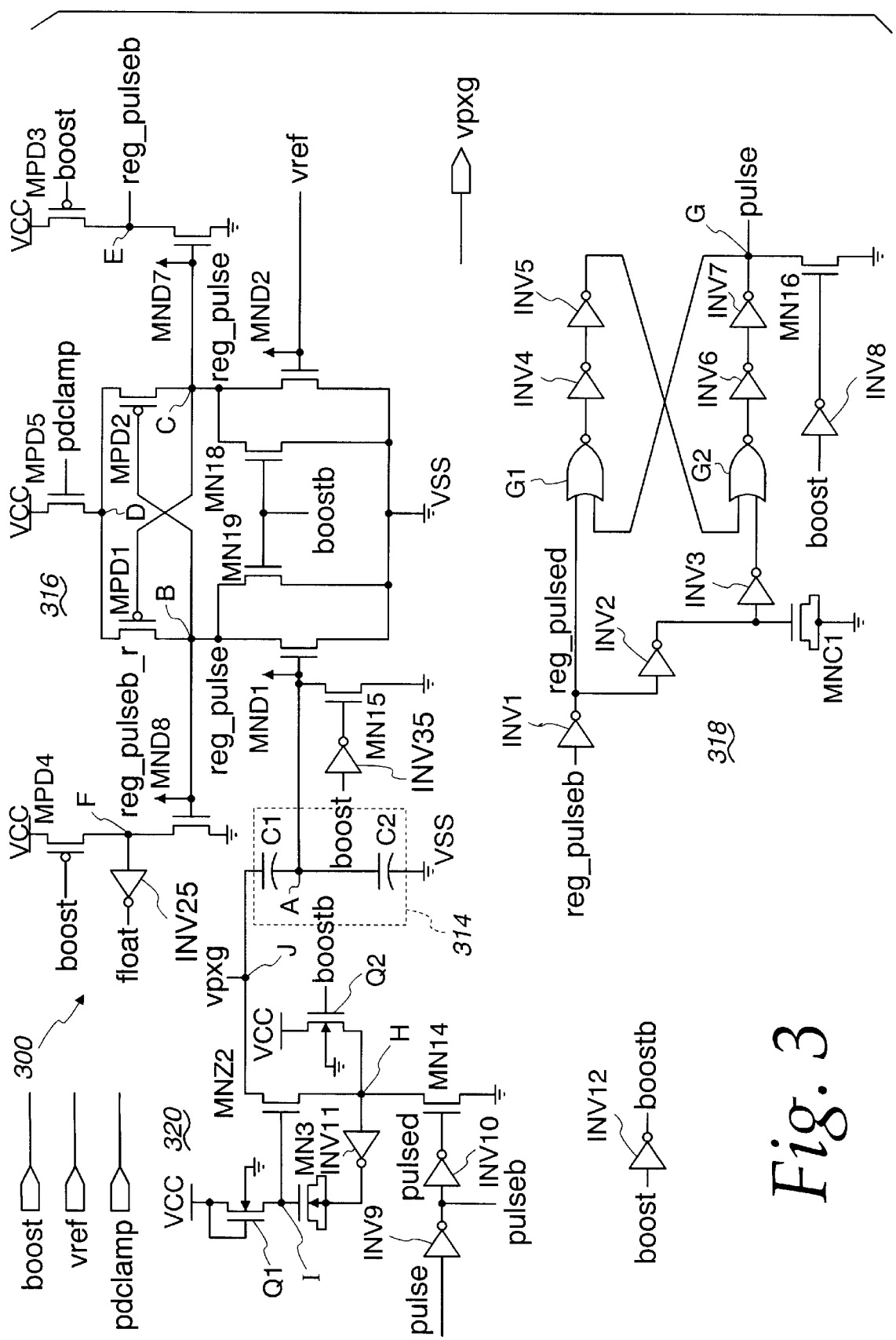
FIG. 3 is a detailed schematic circuit diagram of the clamp stage 12a of FIG. 1 or 112a of FIG. 2.

As can be seen from FIG. 3, there is illustrated a detailed schematic circuit diagram of a clamp circuit stage 300 for use in the clamping circuit 112a of FIG. 2 or the clamping circuit 12a of FIG. 1. The clamp circuit stage 300 includes a sampling circuit formed by a capacitor divider network 314, a comparator circuit 316, a pulse generator circuit 318, and a pull-down circuit 320. The capacitor divider network 314 is formed of a first capacitor C1 and a second capacitor C2 connected to the first capacitor C1 at a node A. The other end of the capacitor C1 is connected to receive the boosted wordline voltage VPXG from the booster circuit 102 at the node 104 (FIG. 2), and the other end of the second capacitor C2 is connected to a ground potential The comparator circuit 316 includes NMOS input transistors MND1, MND2; PMOS load transistors MPD1, MPD2; NMOS output transistors MND7, MND8; and a power-down transistor MPD5. The first input transistor MND1 has its gate connected to the node A from the capacitor divider network 14, its drain connected to a node B, and its source connected to the ground potential VSS. The second input transistor MND2 has its gate connected to receive a stable reference voltage VREF, its drain connected to a node C, and its source connected to the ground potential. The reference voltage VREF is generated by a reference bandgap generator (not shown) which is typically at +1.3 volts. The first load transistor MPD1 has its source connected to a node D, its drain connected also the node B, and its gate connected to the node C. The second load transistor MPD2 has its source connected also to the node D, its drain connected also to the node C, and its gate connected to the node B.

The power-down transistor MPD5 has its gate connected to receive a power-down signal PDCLAMP, its source connected to a power supply potential VCC and its drain connected to the node D. The output transistor MND7 has its gate connected to the node C, its drain connected to a node E for generating a logic signal REG_PULSEB, and its source connected to the ground potential. The output transistor MND8 has its gate connected to the node B, its drain connected to a node F, and its source connected to the ground potential.

A load output transistor MPD3 has its source connected to the power supply potential VCC, its gate connected to receive the boost enable signal BOOST and its drain connected to the node E. Similarly, a load output transistor MPD4 has its source connected to the power supply potential VCC, its gate connected to receive the boost enable signal BOOST and its drain connected to the node F. An inverter INV25 has its input connected to the node F and its output thereof is left floating. The transistors MND8, MPD4 and the inverter INV25 associated with the node F is used to balance the loading as seen at the node C due to the transistors MND7, MPD3.

A first discharge transistor MN19 has its drain connected to the node B, and its source connected to the ground potential VSS. A second discharge transistor MN18 has its drain connected to the node C and its source connected to the ground potential VSS. The gates of the transistors MN19 and MN18 are connected together and receive the complement of the boost enable signal BOOSTB. A pull-down transistor MN15 has its drain connected to the node A, its source connected to the ground potential, and its gate connected to receive the boost enable signal BOOST via an inverter INV35.

The pulse generator 318 includes inverters INV1, INV2, INV3; a capacitor-connected transistor MNC1; NOR logic gates G1, G2; inverters INV4, INV5, INV6, INV7, INV8; and a pull-down transistor MN16. The inverter INV1 has its input connected to receive the logic signal REG_PULSEB at the node E from the comparator 316. The output of the inverter INV1 is connected to the input of the inverter INV2 and to one input of the NOR gate G1. The output of the inverter INV2 is connected to the input of the inverter INV3 and to one side of a capacitor-connected transistor MNC1. The output of the inverter INV3 is connected to one input of the NOR gate G2. The other side of the capacitor MNC1 is connected to the ground potential. The other input of the NOR gate G2 is coupled to the output of the NOR gate G1 via the inverters INV4, INV5. The other input of the NOR gate G1 is coupled to the output of the NOR gate G2 via the inverters INV6, INV7. The transistor MN16 has its drain connected to the output of the inverter INV7 at a node G defining an output signal PULSE of the pulse generator circuit 318. The transistor NM16 has its gate coupled to receive the boost enable signal BOOST via the inverter INV8, and its source connected to the ground potential.

The pull-down circuit 320 is formed of inverters INV9, INV10, INV11, 1NV12; transistors MNZ2, MN14, Q1, Q2; and a capacitor-connected transistor MN3. The transistor MN14 has its gate coupled to receive the pulse signal PULSE at the node G from the pulse generator 318 via the inverters INV9, INV10, its drain connected to the source of the transistor MNZ2 at a node H, and its source connected to the ground potential. The transistor Q2 has its source connected to the power supply potential VCC, its gate connected to receive the boost enable signal BOOST via the inverter INV12, and its drain connected also to the node H. The transistor Q1 has its gate and source connected to the power supply potential VCC and its drain connected to one side of the capacitor-connected transistor MN3 at the node I. The transistor MNZ2 has its drain connected to a node J for receiving the boosted wordline voltage VPXG which is also supplied to the wordline, and its source connected to the node H. The inverter INV11 has its input also connected to the node H and its output connected to the other side of the capacitor-connected transistor MN3.

Figure 4:
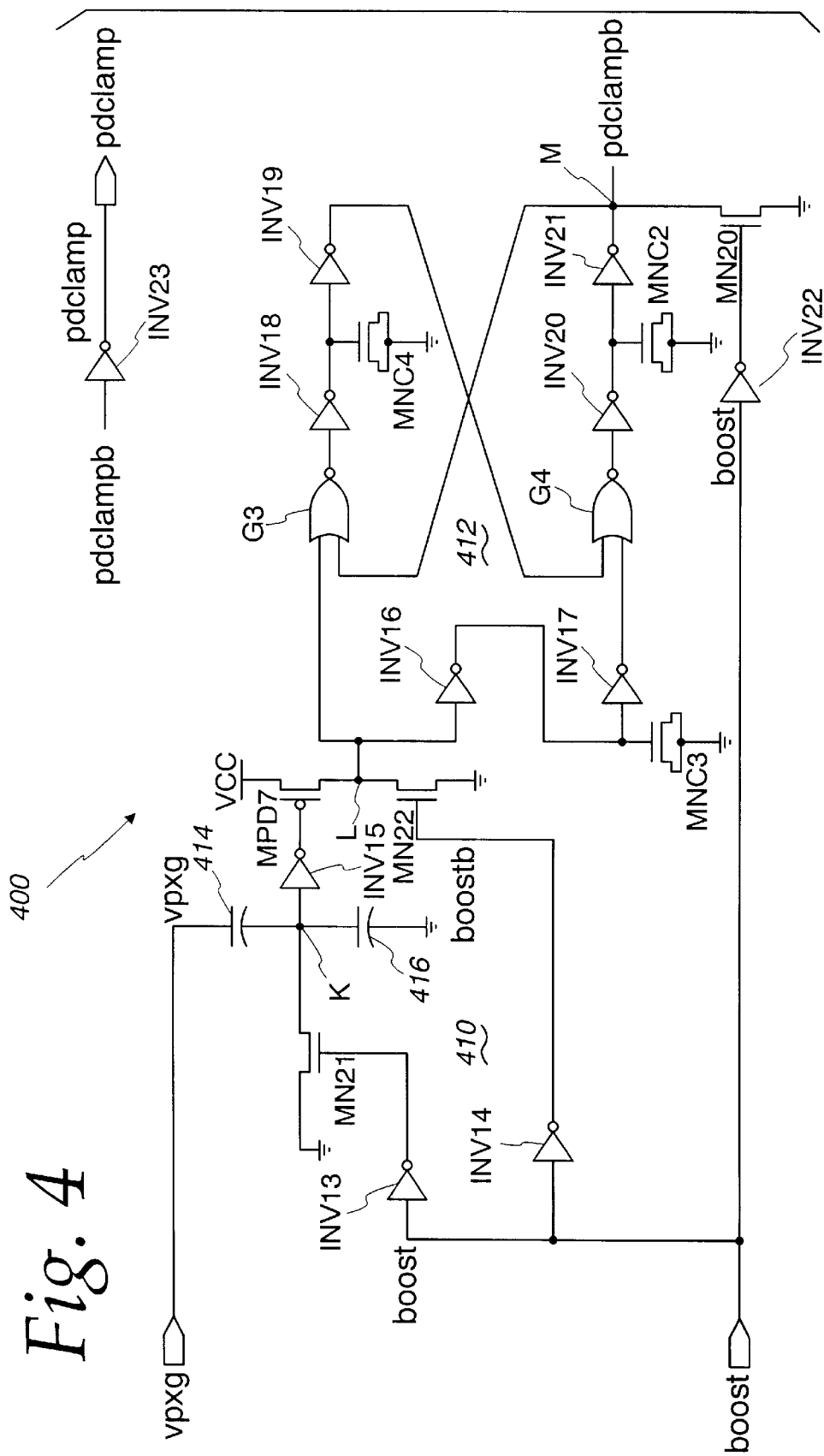
FIG. 4 is a detailed schematic circuit diagram of the power-down clamp circuit 120 of FIG. 2.

In FIG. 4, there is depicted a schematic circuit diagram of a power-down circuit 400 for use in the power-down circuit 120 of FIG. 2. The power-down circuit 400 is formed of an input stage 410 and an output stage 412. The input stage includes capacitors 414, 416; inverters INV13, INV14, INV15; and transistors MN21, MPD7, MN22. The capacitor 414 has its one end connected to receive the boosted wordline voltage VPXG and its other end connected to one end of the capacitor 416 at node K. The other end of the capacitor 416 is connected to the ground potential. The transistor MN21 has its drain connected also to the node K, its gate connected to receive the boost enable signal BOOST via the inverter INV13, and its source connected to the ground potential. The transistor MPD7 has its source connected to the power supply potential VCC, its gate coupled to the node K via the inverter INV15, and its drain connected to the drain of the transistor MN22 at node L defining the output of the input stage. The transistor MN22 has its gate connected to receive the boost enable signal BOOST via the inverter INV14.

The output stage 412 includes inverters INV16, INV17; capacitor-connected transistors MNC2, MNC3, MNC4; NOR gates G3, G4; inverters INV18, INV19, INV20, INV21, INV22, INV23; and a pull-down transistor MN20. The node L is connected to the input of the inverter INV16 and to one input of the NOR gate G3. The output of the inverter INV16 is connected to the input of the inverter INV17 and to one side of the capacitor-connected transistor MNC3. The output of the inverter INV17 is connected to one input of the NOR gate G4. The other side of the capacitor MNC3 is connected to the ground potential.

The other input of the NOR gate G4 is coupled to the output of the NOR gate G3 via the inverters INV18, INV19. The other input of the NOR gate G3 is coupled to the output of the NOR gate G4 via the inverters INV20, INV21. The transistor MN20 has its drain connected to the output of the inverter INV21 at a node M defining an output signal PDCLAMPB. The inverter INV23 has its input connected to the node M and its output providing an output signal PDCLAMP of the power-down circuit 400. The transistor MN20 has its gate connected to receive the boost enable signal BOOST via the inverter INV22, and its source connected to the ground potential. The capacitor MNC4 is connected between the junction of the inverters INV18, INV19 and the ground potential. The capacitor MNC2 is connected between the junction of the inverters INV20, INV21 and the ground potential.

The operation of the clamping circuit of the present invention depicted in the block diagrams of FIGS. 1 and 2 and in the detailed schematic circuit diagrams of FIGS. 3 and 4 will now be explained with reference to the waveforms in FIGS. 5(a)–5(g). Initially, it is assumed that prior to the time t0 the boost enable signal BOOST is at a low logic level, as shown in FIG. 5(a). As a result, the internal voltage BOOSTIN illustrated in FIG. 5(b) will be at the low logic level. With the internal voltage BOOSTIN being low, the boosted wordline voltage VPXG will be set initially at the supply voltage VCC. If the supply voltage is at +3.0 volts, then the boosted wordline voltage will be at approximately 2.75 volts, as shown in FIG. 5(c).

Accordingly, the boosted wordline voltage VPXG at the node J (FIG. 3) will be sampled or divided down by the capacitors C1, C2. For the clamp stage 112a (FIG. 2), the values of the capacitors are selected so that when the boosted wordline voltage VPXG reaches +4.8 volts the voltage at the node A defining a sampled voltage level will exceed the reference voltage level VREF of +1.3 volts. Similarly, for the clamp stage 112b, the values of the capacitors are selected so that when the boosted wordline voltage VPXG reaches +5.5 volts the voltage at the node A will exceed the reference voltage level. Finally, for the clamp stage 112c the values of the capacitors are selected so that when the boosted wordline voltage VPXG reaches +6.0 volts the voltage at the node A will exceed the reference voltage level.

Since the voltage VPXG is approximately +2.75 volts the time t0, the logic signal REG_PULSEB at the node of the comparator 316 (FIG. 3) will be at a high logic level, and the output signal PULSE at the node G of the pulse generator 318 will be at a low logic level. The output signal PULSE for the clamp stage 112a is shown in FIG. 5(e). Similarly, the output signal PULSE for the clamp stages 112b and 112c are illustrated in respective FIGS. 5(f) and 5(g). Further, since the output signal PULSE is low, the transistor MN14 in the pull-down circuit 320 (FIG. 3) will be turned OFF. Thus, the boosted wordline voltage VPXG will not have a conduction path to ground, even though the transistor MNZ2 is turned ON due to the pre-charging of the node I by the transistor Q1.

At the time t0, when the boost enable signal BOOST goes high, as shown in FIG. 5(a), the internal boost voltage BOOSTIN as shown in FIG. 5(b) will be generated shortly thereafter beginning at time t1. In this instance, the width of the pulse voltage BOOSTIN is approximately 40 nS and the amplitude thereof is about +5.5 volts. At time t2, the power-down clamp circuit 400 (FIG. 4) will generate a negative pulse, as shown in FIG. 5(d), as will be more fully explained hereinafter. The leading edge 50 of the negative pulse will cause the pull-down transistor MPD5 (FIG. 3) to be turned ON which will allow the comparator circuit 316 to become activated. When the leading edge 52 in FIG. 5(c) of the boosted wordline voltage VPXG reaches a first predetermined level of +4.8 volts, the voltage at the node A will cause the transistor MND1 to turn ON, which will in turn cause the transistor MPD2 to turn ON. As a result, the output transistor MND7 will be turned ON, thereby pulling the node E low.

When the node E goes low, the leading edge 54 in FIG. 5(e) of the signal PULSEA from the clamp circuit 112a will be generated at the node G at time t3. With the node G going low, the transistor MN14 in the pull-down circuit 320 will be turned ON so as to create a path to ground. As a result, the boosted wordline voltage VPXG will be pulled down and clamped at approximately 4.5 volts so as to prevent the wordline from being over-boosted. When the capacitor-connected transistor MNC1 discharges down to the trip point (i.e., +2.5 volts) of the inverter INV3, the node G will go low again. Thus, it can be seen that the width W1 of the signal PULSEA is determined by the size of the capacitor MNC1. The turn-on resistances of the two series-connected transistors MNZ2 and MN14 will control the slope of the curved portion 56 of the boosted wordline voltage, as illustrated in FIG. 5(c).

The clamp stage 112b operates in an identical manner to the clamp stage 112a as just described. However, the leading edge 58 of the signal PULSEB at time t4 will not be generated until the boosted wordline voltage VPXG exceeds +5.5 volts. This is illustrated in FIG. 5(f). The width W2 of the signal PULSEB is controlled by the capacitor-connected transistor MNC1in the clamp circuit 112b. Further, the turn-on resistance of the two transistors MNZ2 and MN14 in the pull-down circuit 320 will cause the slope of the curved portion 56 to change.

Similarly, the clamp stage 112c operates in an identical manner to the clamp stages 112a and 112b as described above. However, the leading edge 60 in FIG. 5(g) of the signal PULSEC at the time t5 will not be generated until the boosted wordline voltage exceeds +6.0 volts. The width W3 of the signal PULSEC is controlled by the capacitor-connected transistor MNC1 in the clamp stage 112c. In addition, the turn-on resistance of the two transistors MNZ2 and MN14 in the pull-down circuit 320 will cause the slope of the curved portion 56 of the boosted wordline voltage VPXG to be varied.

The operation of the power-down clamp circuit 400 of FIG. 4 will now be explained with reference to FIG. 5(d). As previously pointed out, since both the boost enable signal BOOST and the internal boost signal BOOSTIN will be low prior to the time t1, the voltage at the node K will be initially zero volts and thus the node L will also be at zero volts. As a result, the output signal PDCLAMP at the output of the inverter INV23 will be at a high logic level. The relative sizes of the P-channel and N-channel transistors in the inverter INV15 are typically selected so that the trip point is about one-half of the supply potential VCC, or +1.5 volts. Then, the sizes of the capacitors 414 and 416 are selected so that when the boosted wordline voltage VPXG reaches about +4.0 volts the node K will cause the output of the inverter INV15 to go low. This will in turn cause the output of the inverter INV23 to go low (leading edge 50) at the time t2. When the capacitor-connected transistor MNNC3 discharges down to the trip point of the inverter INV17, the output of the inverter INV23 will go high again. Thus, the width W4 of the negative pulse PDCLAMP is determined by the size of the capacitor MNC3.

In order to conserve power, the power-down transistor MPD5 in the comparator circuit 316 only receives the power supply potential VCC during a very short time for sampling of the boosted wordline voltage VPXG at the node A and allows a transition to occur at the node E. Thus, the width W4 of the negative pulse PDCLANP can be made to be very short on the order of 2–5 nS. Further, it will be noted that the leading edge 50 must occur prior to the time the boosted wordline voltage VPXG reaches the first predetermined level, or +4.8 volts.

From the foregoing detailed description, it can thus be seen that the present invention provides a boost level clamping circuit for clamping a boosted wordline voltage from a booster circuit used in a semiconductor memory device which is power supply and process corner independent. The clamping circuit of the present invention includes a plurality of parallel-connected clamp stages connected to the boosted wordline voltage from the booster circuit. Each of the plurality of clamp stages serves to clamp the boosted wordline voltage at different predetermined levels. Each of the clamp stages is formed of a sampling circuit, a comparator circuit, a pulse generator, and a pull-down circuit.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A boost level clamping circuit for clamping a boosted wordline voltage from a booster circuit used in a semiconductor memory device which is power supply and process corner independent, said clamping circuit comprising:

a plurality of parallel-connected clamp stage means connected to said boosted wordline voltage from said booster circuit;

said plurality of clamp stage means including at least first clamp stage means for clamping said boosted wordline voltage only when it reaches a first predetermined level, second clamp stage means for clamping said boosted wordline voltage only when it reaches a second predetermined level which is higher than said first predetermined level, and third clamp stage means for clamping said boosted wordline voltage only when it reaches a third predetermined level which is higher than said second predetermined level;

each of said first, second and third clamp stage means being formed of:
  (a) sampling means for sampling said boosted wordline voltage;
  (b) comparator means for comparing a sampled voltage level of said boosted wordline voltage and a reference voltage level and for generating a low logic signal when said sampled voltage level is greater than said reference voltage level;
  (c) pulse generator means responsive to said low logic signal for generating a clamp pulse; and
  (d) pull-down means responsive to said clamp pulse for pulling down said boosted wordline voltage so as to prevent over-boosting of a wordline connected thereto.

2. A boost level clamping circuit as claimed in claim 1, wherein said sampling means includes a capacitor divider network formed of a first capacitor and a second capacitor connected in series between said boosted wordline voltage and a ground potential, the junction of said first and second capacitors providing said sampled voltage level.

3. A boost level clamping circuit as claimed in claim 2, wherein said comparator means includes a first input transistor having its gate to receive said sampled voltage level, a second input transistor having its gate connected to said reference voltage level, and an output transistor having its gate connected to the drain of said second input transistor and its drain for providing said low logic signal.

4. A boost level clamping circuit as claimed in claim 3, wherein said pulse generator means includes a pair of first and second NOR gates, said first NOR gate having a first input coupled to the output of said second NOR gate, said second NOR gate having a first input coupled to the output of said first NOR gate, and said first and second NOR gates having their respective second inputs coupled to receive said low logic signal, said output of said second NOR gate generating said clamp pulse.

5. A boost level clamping circuit as claimed in claim 4, wherein said pull-down means includes first and second transistors connected in series between said boosted wordline voltage and said ground potential, said first transistor having its gate connected to a precharged voltage for turning ON the same, said second transistor having its gate connected to receive said clamp pulse for turning ON so as to pull down said boosted wordline voltage.

6. A boost level clamping circuit as claimed in claim 1, further comprising power-down clamp means for supplying power to said comparator means only when said boosted wordline voltage is being sampled in order to conserve power.

7. A boost level clamping circuit as claimed in claim 6, wherein said power-down clamp means generates a negative pulse having a width which is only long enough to allow for sampling of said boosted wordline voltage.

8. A boost level clamping circuit as claimed in claim 7, wherein said negative pulse has a width of between 2–5 nS.

9. A boost level clamping circuit as claimed in claim 1, wherein said first predetermined level is approximately +4.8 volts, said second predetermined level is approximately +5.5 volts, and said third predetermined level is approximately +6.0 volts.

10. A boost level clamping circuit for clamping a boosted wordline voltage from a booster circuit used in a semiconductor memory device which is power supply and process corner independent, said clamping circuit comprising:
  (a) sampling means for sampling said boosted wordline voltage;
  (b) comparator means for comparing a sampled voltage level of said boosted wordline voltage and a reference voltage level and for generating a low logic signal when said sampled voltage level is greater than said reference voltage level;
  (c) pulse generator means responsive to said low logic signal for generating a clamp pulse; and
  (d) pull-down means responsive to said clamp pulse for pulling down said boosted wordline voltage so as to prevent over-boosting of a wordline connected thereto.

11. A boost level clamping circuit as claimed in claim 10, wherein said sampling means includes a capacitor divider network formed of a first capacitor and a second capacitor connected in series between said boosted wordline voltage and a ground potential, the junction of said first and second capacitors providing said sampled voltage level.

12. A boost level clamping circuit as claimed in claim 11, wherein said comparator means includes a first input transistor having its gate to receive said sampled voltage level, a second input transistor having its gate connected to said reference voltage level, and an output transistor having its gate connected to the drain of said second input transistor and its drain for providing said low logic signal.

13. A boost level clamping circuit as claimed in claim 12, wherein said pulse generator means includes a pair of first and second NOR gates, said first NOR gate having a first input coupled to the output of said second NOR gate, said second NOR gate having a first input coupled to the output of said first NOR gate, and said first and second NOR gates having their respective second inputs coupled to receive said low logic signal, said output of said second NOR gate generating said clamp pulse.

14. A boost level clamping circuit as claimed in claim 13, wherein said pull-down means includes first and second transistors connected in series between said boosted wordline voltage and said ground potential, said first transistor having its gate connected to a precharged voltage for turning ON the same, said second transistor having its gate connected to receive said clamp pulse for turning ON so as to pull down said boosted wordline voltage.

15. A boost level clamping circuit as claimed in claim 10, further comprising power-down clamp means for supplying power to said comparator means only when said boosted wordline voltage is being sampled in order to conserve power.

16. A boost level clamping method for clamping a boosted wordline voltage from a booster circuit used in a semiconductor memory device which is power supply and process corner independent, said clamping method comprising the steps of:
  sampling said boosted wordline voltage;
  comparing a sampled voltage level of said boosted wordline voltage and a reference voltage level;
  generating a low logic signal when said sampled voltage level is greater than said reference voltage level;
  generating a clamp pulse in response to said low logic signal; and pulling down said boosted wordline voltage in response to said clamp pulse so as to prevent over-boosting of a wordline connected thereto.

17. A boost level clamping method as claimed in claim 16, further comprising the step of supplying power to said comparator means only when said boosted wordline voltage is being sampled in order to conserve power.

18. A boost level clamping method as claimed in claim 17, wherein the step of supplying power includes the step of generating a negative pulse having a width which is only long enough to allow for sampling of said boosted wordline voltage.

* * * * *